US006924561B1

(12) United States Patent
Hill et al.

(10) Patent No.: US 6,924,561 B1
(45) Date of Patent: Aug. 2, 2005

(54) SRAM FORMATION USING SHADOW IMPLANTATION

(75) Inventors: Wiley Eugene Hill, Moss Beach, CA (US); Bin Yu, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/728,910

(22) Filed: Dec. 8, 2003

(51) Int. Cl.$^7$ .............................................. H01L 27/11
(52) U.S. Cl. ..................................... 257/903; 257/401
(58) Field of Search ................................ 257/903, 401

(56) References Cited

U.S. PATENT DOCUMENTS

| | | | |
|---|---|---|---|
| 4,996,574 A | 2/1991 | Shirasaki | .................... 357/23.7 |
| 2003/0102518 A1 * | 6/2003 | Fried et al. | .................. 257/401 |

OTHER PUBLICATIONS

Digh Hisamoto et al., "FinFet–A Self–Aligned Double–Gate MOSFET Scalable to 20 nm," IEEE Transactions on Electron Devices, vol. 47, No. 12, Dec. 2000, pp. 2320–2325.
Yang–Kyu Choi et al., "Sub–20nm CMOS FinFet Technologies," 2001 IEEE, IEDM, pp. 421–424.
Xuejue Huang et al., "Sub–50 nm P–Channel FinFet," IEEE Transactions on Electron Devices, vol. 48, No. 5, May 2001, pp. 880–886.

Xuejue Huang et al., "Sub 50–nm FinFet: PMOS," 1999 IEEE, IEDM, pp. 67–70.
Yang–Kyu Choi et al., "Nanoscale CMOS Spacer FinFET for the Terabit Era," IEEE Electron Device Letters, vol. 23, No. 1, Jan. 2002, pp. 25–27.
Co–pending U.S. Appl. No. 10/638,334, filed Aug. 12, 2003, entitled: "Systems and Methods for Forming Dense N–Channel and P–Channel Fins Using Shadow Implantation," 16 page specification, 18 sheets of drawings.
Co–pending U.S. Appl. No. 10/429,697, filed May 6, 2003, entitled: "FinFet–Based SRAM Cell," 16 page specification, 12 sheets of drawings.

* cited by examiner

Primary Examiner—David Nelms
Assistant Examiner—Tu-Tu Ho
(74) Attorney, Agent, or Firm—Harrity & Snyder LLP (57) ABSTRACT

A memory device includes multiple fins formed adjacent to one another, a source region, a drain region, a gate, a wordline, and a bitline contact. At least one of the multiple fins is doped with a first type of impurities and at least one other one of the fins is doped with a second type of impurities. The source region is formed at one end of each of the fins and the drain region is formed at an opposite end of each of the fins. The gate is formed over two of the multiple fins, the wordline is formed over each of the multiple fins, and a bitline contact is formed adjacent at least one of the multiple fins.

13 Claims, 14 Drawing Sheets

SRAM FORMATION USING SHADOW IMPLANTATION

FIELD OF THE INVENTION

The present invention relates generally to semiconductor devices and, more particularly, to systems and methods for creating static random access memory (SRAM) using shadow implanting techniques.

BACKGROUND OF THE INVENTION

The escalating demands for high density and performance associated with ultra large scale integration semiconductor devices require design features, such as gate lengths, below 100 nanometers (mm), high reliability, and increased manufacturing throughput. The reduction of design features below 100 mm challenges the limitations of conventional methodology.

Double-gate MOSFETs represent devices that are candidates for succeeding existing planar MOSFETs. In double-gate MOSFETs, the use of two gates to control the channel significantly suppresses short-channel effects. A FinFET is a double-gate structure that includes a channel formed in a vertical fin. Although a double-gate structure, the FinFET is similar to existing planar MOSFETs in layout and fabrication techniques. The FinFET also provides a range of channel lengths, CMOS compatibility, and large packing density compared to other double-gate structures.

SUMMARY OF THE INVENTION

Implementations consistent with the principles of the invention use shadow implanting of tightly spaced FinFET devices to produce high-density SRAM cells. Utilization of shadowed N/P implants permits reduction of SRAM cell size by approximately 40–50%.

In one aspect consistent with the principles of the invention, a memory device is provided. The memory device includes multiple fins formed adjacent to one another, at least one of the fins being doped with a first type of impurities and at least one other one of the fins being doped with a second type of impurities. The memory device further includes a source region formed at one end of each of the fins and a drain region formed at an opposite end of each of the fins. The memory device also includes a gate formed over two of the plurality of fins, a wordline formed over each of the multiple fins, and a bitline contact formed adjacent at least one of the multiple fins.

According to another aspect, a method of doping fins of a semiconductor device that includes a substrate is provided. The method includes forming multiple fin structures on the substrate, each of the fin structures including a cap formed on a fin. The method further includes performing a first tilt angle implant process to dope a first pair of the multiple fin structures with n-type impurities and performing a second tilt angle implant process to dope a second pair of the multiple fin structures with p-type impurities.

According to a further aspect, a method for forming a memory device is provided. The method includes forming multiple fins adjacent to one another, at least one of the fins being doped with a first type of impurities and at least one other one of the fins being doped with a second type of impurities. The method further includes forming a source region at one end of each of the fins and forming a drain region at an opposite end of each of the fins. The method also includes forming a gate over two of the multiple fins, forming a wordline over each of the multiple fins, and forming a bitline contact adjacent at least one of the multiple fins.

BRIEF DESCRIPTION OF THE DRAWINGS

The accompanying drawings, which are incorporated in and constitute a part of this specification, illustrate an embodiment of the invention and, together with the description, explain the invention. In the drawings.

DETAILED DESCRIPTION

The following detailed description of implementations consistent with the present invention refers to the accompanying drawings. The same reference numbers in different drawings may identify the same or similar elements. Also, the following detailed description does not limit the invention. Instead, the scope of the invention is defined by the appended claims and their equivalents.

Implementations consistent with the principles of the invention provide techniques for fabricating high-density SRAM cells using shadowed implant techniques.

Figure 1:
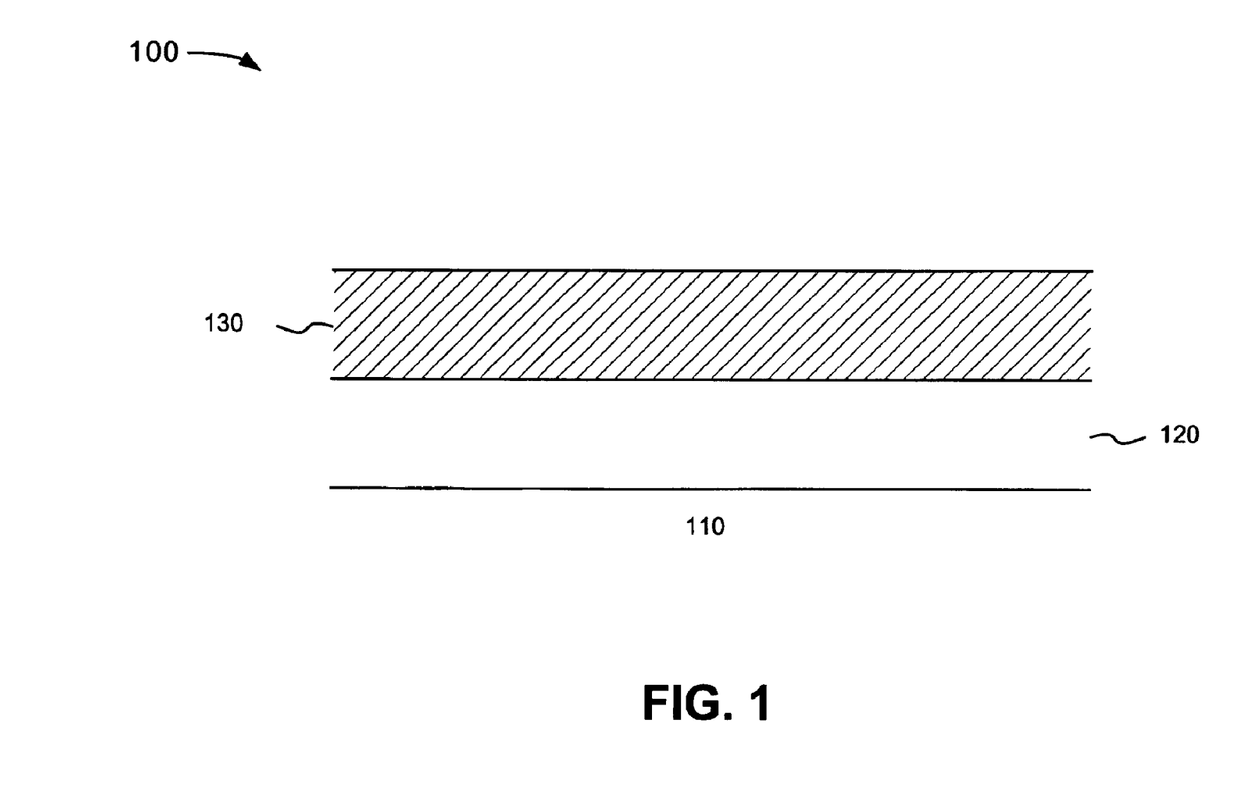
FIG. 1 illustrates a silicon on insulator structure consistent with the invention.

FIG. 1 illustrates a cross-section of a silicon on insulator (SOI) structure 100 formed in accordance with implementations consistent with the invention. SOI 100 may include a buried oxide layer on a silicon substrate (collectively shown in FIG. 1 as substrate 110) and a silicon layer 120 formed on the buried oxide layer. In alternative implementations, substrate 110 and layer 120 may include other semiconductor materials, such as germanium, or combinations of semiconductor materials, such as silicon-germanium. The buried oxide layer may include a silicon oxide or other types of dielectric materials.

Silicon layer 120 may be formed on substrate 110 using a conventional deposition technique. The thickness of silicon layer 120 may range from about 50 Å to 500 Å. In an exemplary implementation, silicon layer 120 may be deposited to a thickness of approximately 50 Å. It will be appreciated that silicon layer 120 may be used to form one or more fins.

A thick cap layer 130 (or hard mask) may be formed on top of silicon layer 120 to aid in pattern optimization and protect silicon layer 120 during subsequent processing. Cap layer 130 may, for example, include a silicon nitride material or some other type of material capable of protecting silicon layer 120 during the fabrication process. Cap layer 130 may be deposited, for example, by chemical vapor deposition (CVD) to a thickness ranging from approximately 50 Å to 200 Å. In an exemplary implementation, cap layer 130 may be deposited to a thickness of approximately 50 Å.

Figure 2A:
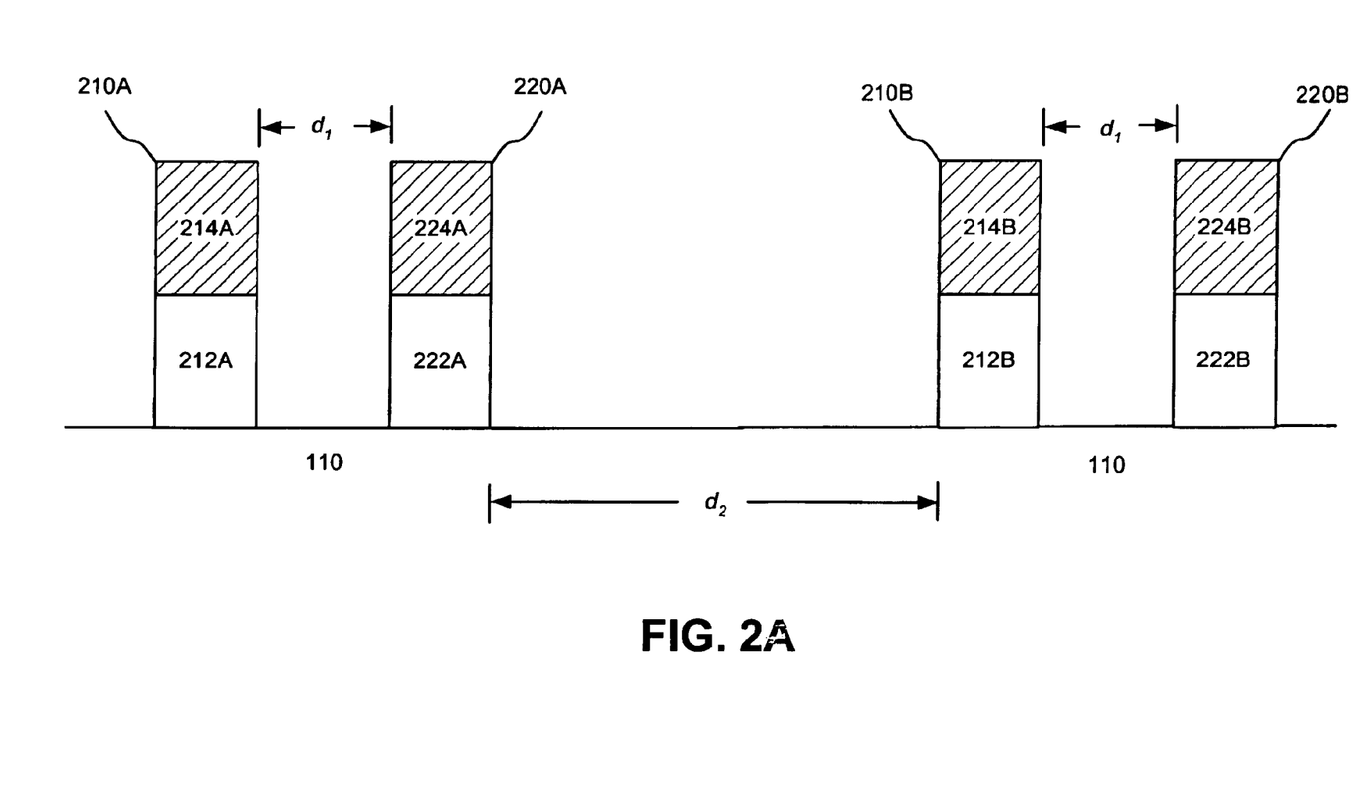
FIGS. 2A and 2B illustrate exemplary fin formation consistent with the invention.
Figure 2B:
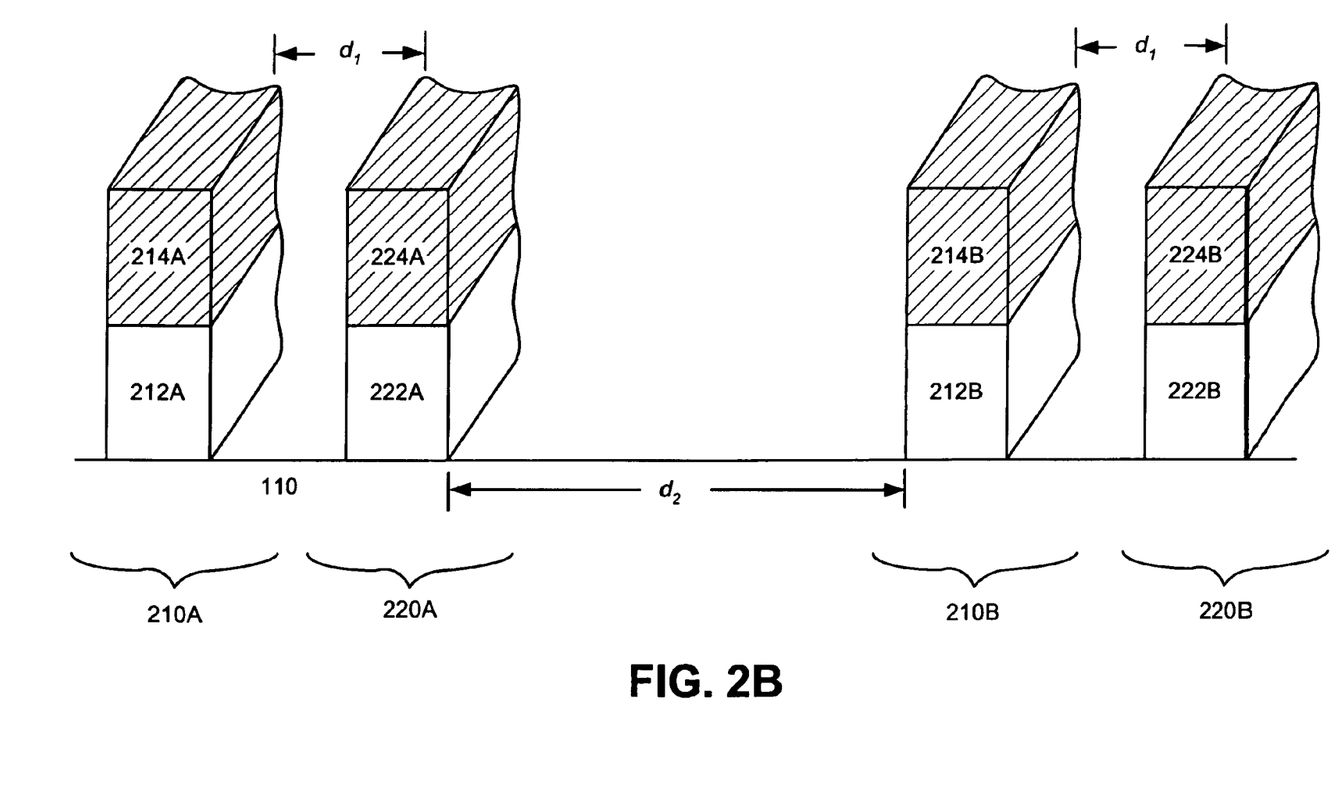

Silicon layer 120 may be patterned by conventional lithographic techniques (e.g., optical or electron beam (EB) lithography). Silicon layer 120 may then be etched using well-known etching techniques to form multiple fin structures 210A, 210B, 220A and 220B, as illustrated in FIG. 2A. FIG. 2B shows a three dimensional view of FIG. 2A.

As shown in FIGS. 2A and 2B, fin structure 210A/220A includes a fin 212A/222A and a cap 214A/224A and fin structure 210B/220B includes a fin 212B/222B and a cap 214B/224B. Caps 214A/224A may remain covering fin 212A/222A and caps 214B/224B may remain covering fin 212B/222B. The width of fin structures 210A, 220A, 2101B and 220B may range from approximately 50 Å to 500 Å. In an exemplary implementation, the width of each of fin structures 210A, 220A, 210B and 220B maybe approximately 50 Å. A distance $d_1$ between side surfaces of fin structure 210A and fin structure 220A and between side surfaces of fin structure 210B and 220B may be approximately twice the width of fin structures 210A and 220A. $d_1$ may, thus, range from approximately 100 Å to 1000 Å. A distance $d_2$ between side surfaces of fin structure 220A and 210B may be approximately four times the width of fin structures 220A and 210B. $d_2$ may, thus, range from approximately 200 Å to 2000 Å. In one implementation, for example, the distance $d_1$ may be approximately 100 Å and the distance $d_2$ may be approximately 200 Å.

Figure 3A:
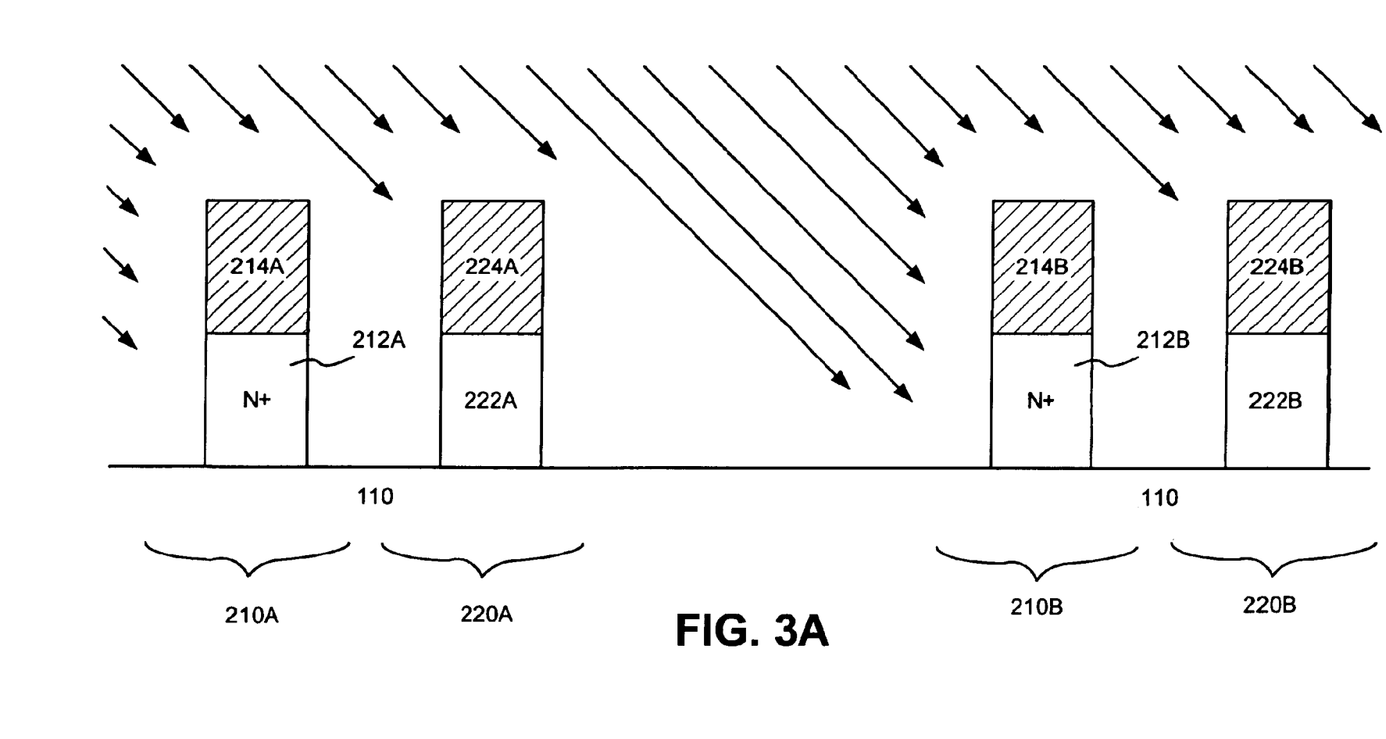
FIGS. 3A and 3B illustrate exemplary N implantation using shadowing techniques consistent with the invention.
Figure 3B:
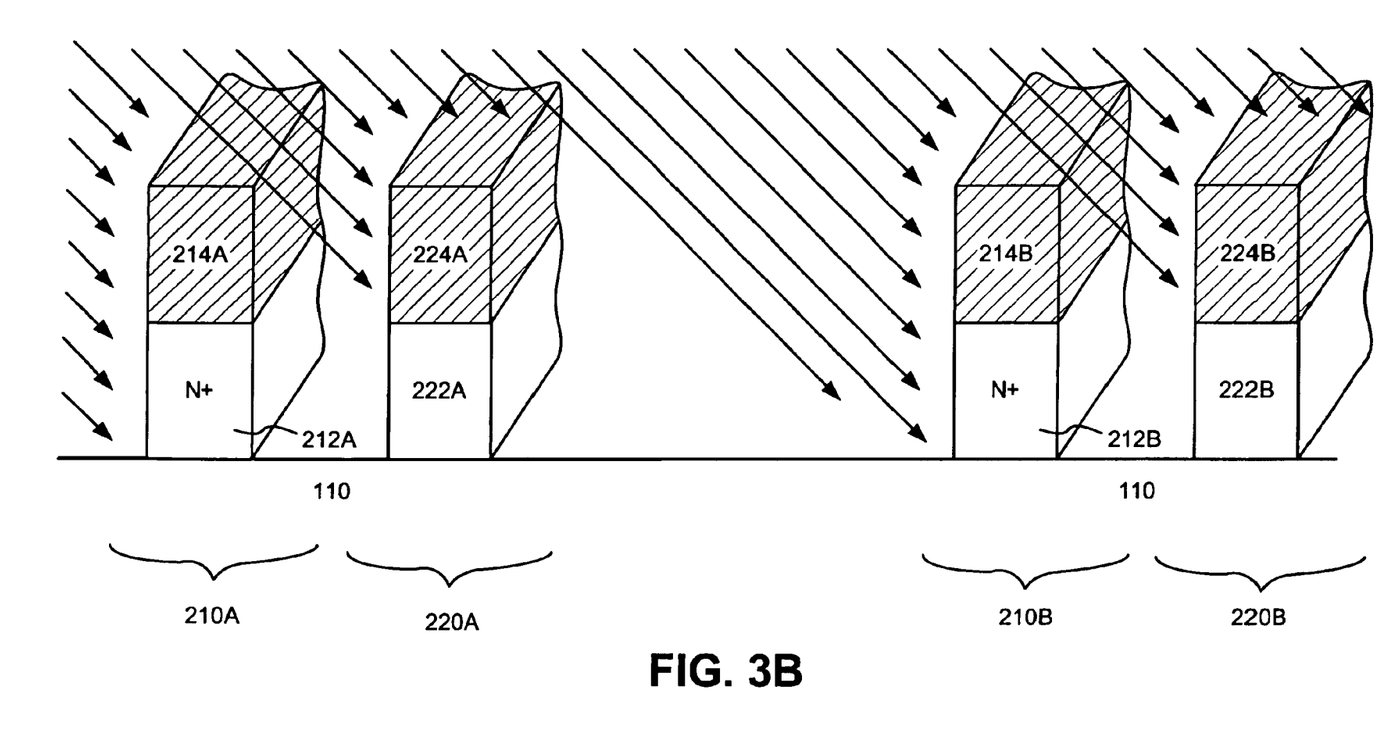

A tilt angle implant process may then be performed to dope fins 212A, 212B, 222A and 222B. For example, a conventional implant process of n-type impurities, such as arsenic or phosphorus, may be performed to dope fins 212A and 212B, as illustrated in FIG. 3A. FIG. 3B shows a three dimensional view of FIG. 3A. As shown in FIGS. 3A and 3B, n-type impurities may be implanted at an angle ranging from approximately 40 degrees to 50 degrees. In an exemplary implementation, the implant process may be performed at an angle of approximately 45 degrees. The particular angle used may be dependent upon the height of cap 214/224. For example, if the height of cap 214/224 is approximately equal to the height of fin 212/222, then the angle used may be less than or equal to 45 degrees.

The n-type impurities may be implanted at a dosage of about $5 \times 10^{14}$ atoms/cm$^2$ to about $1 \times 10^{15}$ atoms/cm$^2$ and an implantation energy of about 3–6 KeV for phosphorus or about 5–10 KeV for arsenic, which may depend on the thickness of fin 212. After the implant process is complete, fins 212A and 212B may include silicon doped predominately, or only, with n-type impurities, as illustrated in FIGS. 3A and 3B.

As shown in FIGS. 3A and 3B, the implanting of n-type impurities does not dope fins 222A and 222B. There are several factors that aid in preventing the n-type impurities from reaching fins 222A and 222B. For example, the presence, height, and closeness of fin structure 210 shields or shadows fin 222, thereby blocking the n-type impurities from reaching fin 222. The presence of cap 224 also helps block the n-type impurities.

Figure 4A:
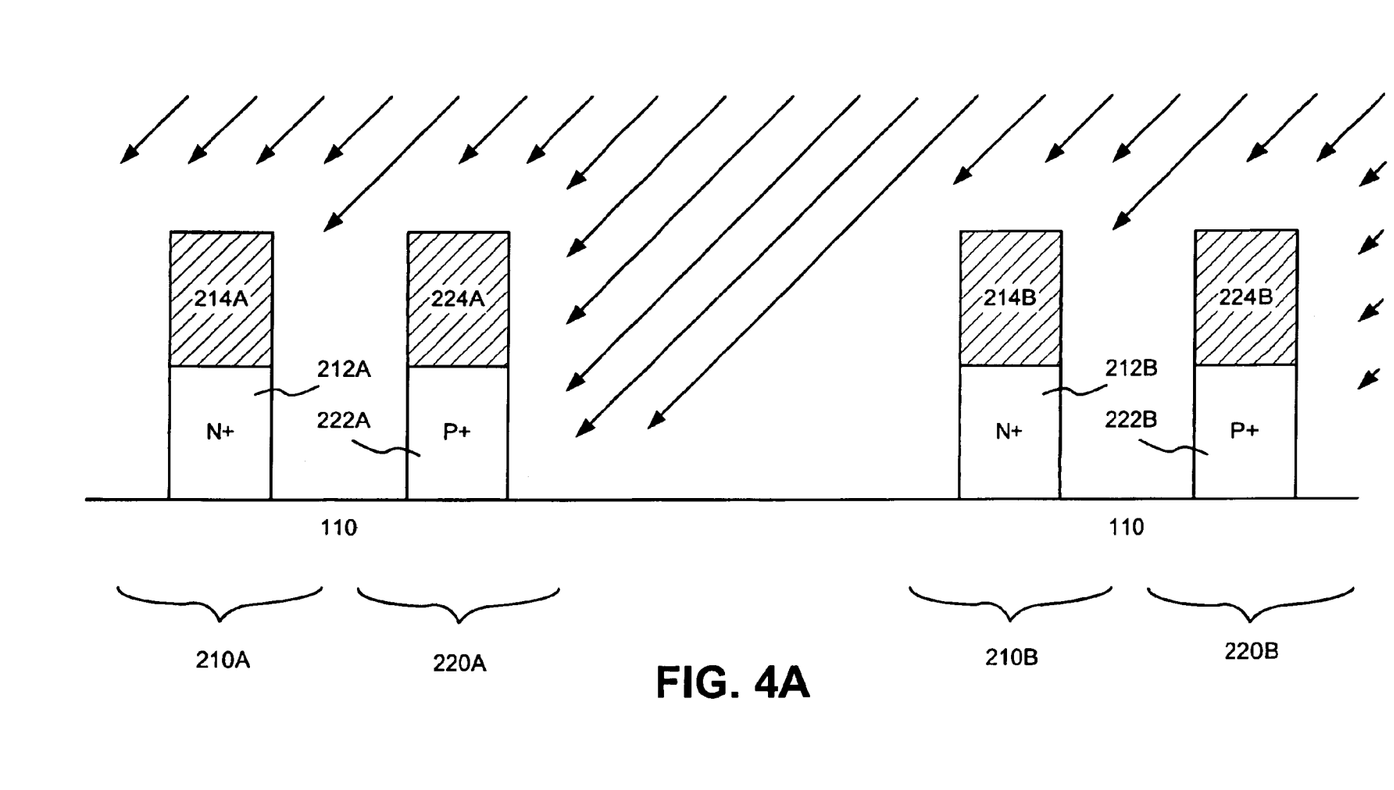
FIGS. 4A and 4B illustrate exemplary P implantation using shadowing techniques consistent with the invention.
Figure 4B:
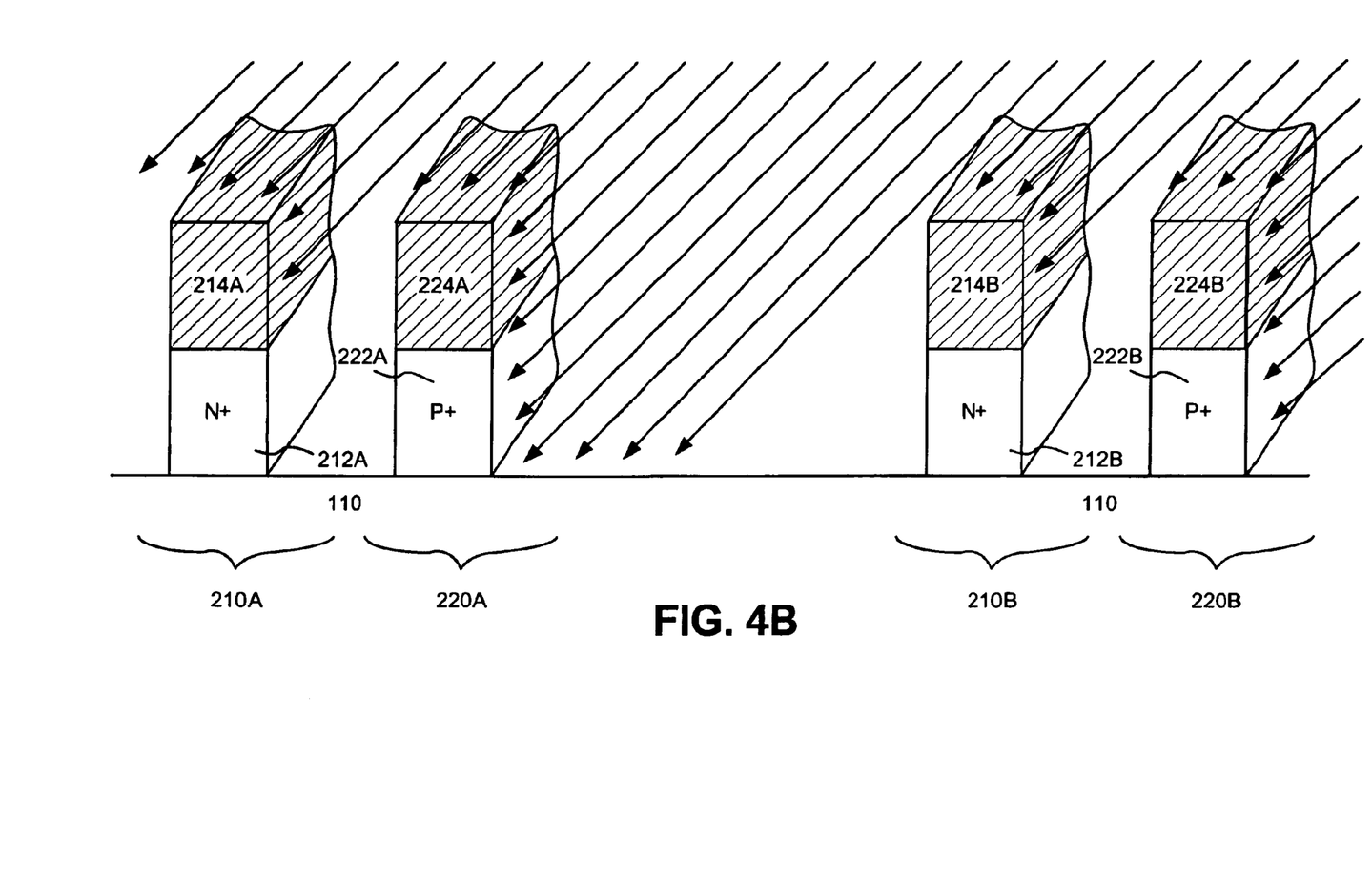

A tilt angle implant process of type impurities, such as boron or BF$_2$, may be performed to dope fins 222A and 222B, as illustrated in FIG. 4A. FIG. 4B shows a three dimensional view of FIG. 4A. As shown in FIGS. 4A and 4B, p-type impurities may be implanted at an angle ranging from approximately 40 degrees to 50 degrees. In an exemplary implementation, the implant process may be performed at an angle of approximately 45 degrees. The particular angle used may be dependent upon the height of cap 214/224. For example, if the height of cap 214/224 is approximately equal to the height of fin 212/222, then the angle used may be less than or equal to 45 degrees.

The p-type impurities may be implanted at a dosage of about $5 \times 10^{14}$ atoms/cm$^2$ to about $1 \times 10^{15}$ atoms/cm$^2$ and an implantation energy of about 2 KeV to about 3 KeV for boron, which may depend on the thickness of fin 222. After the implant process is complete, fins 222A and 222B may include silicon doped predominately, or only, with p-type impurities, as illustrated in FIGS. 4A and 4B.

As shown in FIGS. 4A and 4B, the implanting of p-type impurities does not dope fins 212A and 212B. There are several factors that aid in preventing the p-type impurities from reaching fins 212A and 212B. For example, the presence, height, and closeness of fin structure 220 shields or shadows fin 212 blocks the p-type impurities from reaching fin 212. The presence of cap 224 also helps block the p-type impurities.

It may also be desirable to dope fins 212 and 222 from the other side (i.e., the sides of fins 212 and 222 facing each other). This may be desirable in instances where the dopant does not fully dope fins 212 and 222.

Figure 5A:
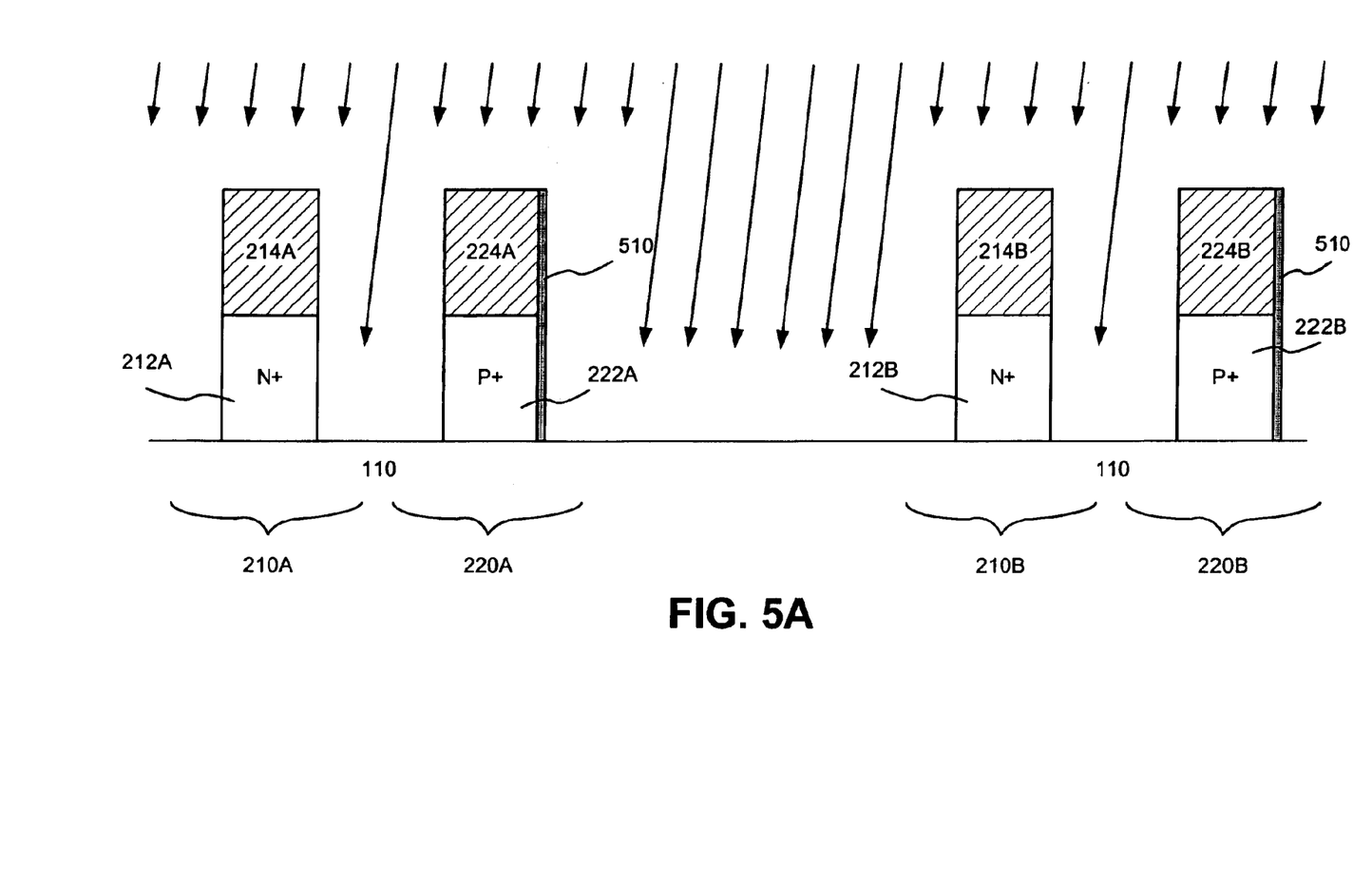
FIGS. 5A, 5B, 6A and 6B illustrate additional shadow implantation techniques consistent with the invention.
Figure 5B:
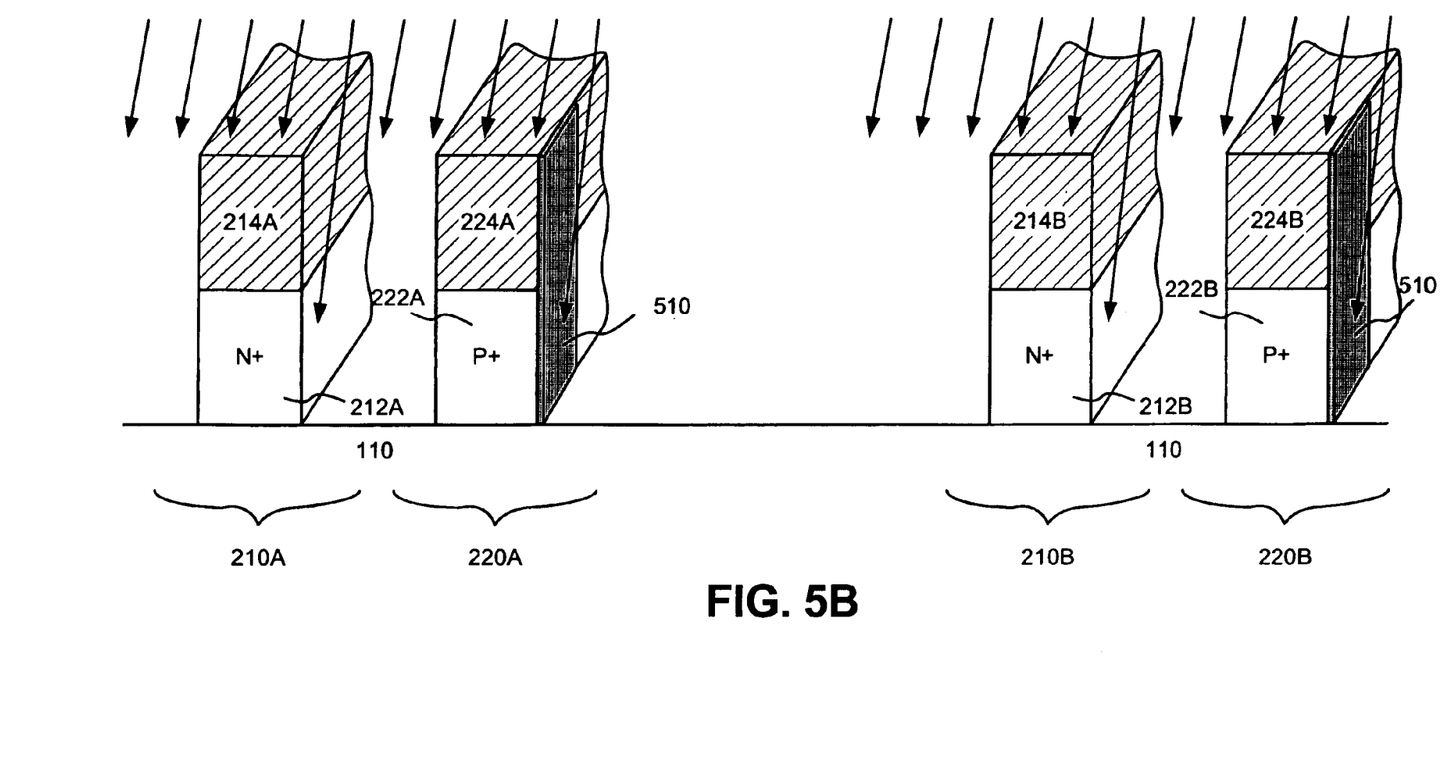

In this case, a hardened resist may optionally be formed on non-shadowed sides of fin structures 210 and 220. Another group of tilt angle implant processes may then optionally be performed to dope fins 212A, 212B, 222A and 222B. For example, a hardened resist 510 may be formed on the non-shadowed side surface of fin structure 220, as illustrated in FIG. 5A. FIG. 5B shows a three dimensional view of FIG. 5A. Resist 510 may be formed to a thickness ranging from approximately 100 Å to 200 Å. In an exemplary implementation, resist 510 may be formed to a thickness of approximately 150 Å. While FIG. 5B shows resist 510 covering only a portion of fin structure 220, resist 510 may be formed to cover the entire non-shadowed side of fin structure 220.

A conventional implant process of n-type impurities, such as arsenic or phosphorus, may be performed to dope fins 212A and 212B, as illustrated in FIGS. 5A and 5B. The n-type impurities may be implanted at an angle ranging from approximately 40 degrees to 50 degrees. In an exemplary implementation, the implant process may be performed at an angle of approximately 45 degrees.

The n-type impurities may be implanted at a dosage of about $5 \times 10^{14}$ atoms/cm$^2$ to about $1 \times 10^{15}$ atoms/cm$^2$ and an implantation energy of about 3–6 KeV for phosphorus or about 5–10 KeV for arsenic, which may depend on the thickness of fin 212. After the implant process is complete, fins 212A and 212B may include silicon doped predominately, or only, with n-type impurities, as illustrated in FIGS. 5A and 5B. The implanting of n-type impurities does not dope fins 222A and 222B. For example, resist 510 and cap 224 block the n-type impurities from reaching fins 222A and 222B.

Figure 6A:
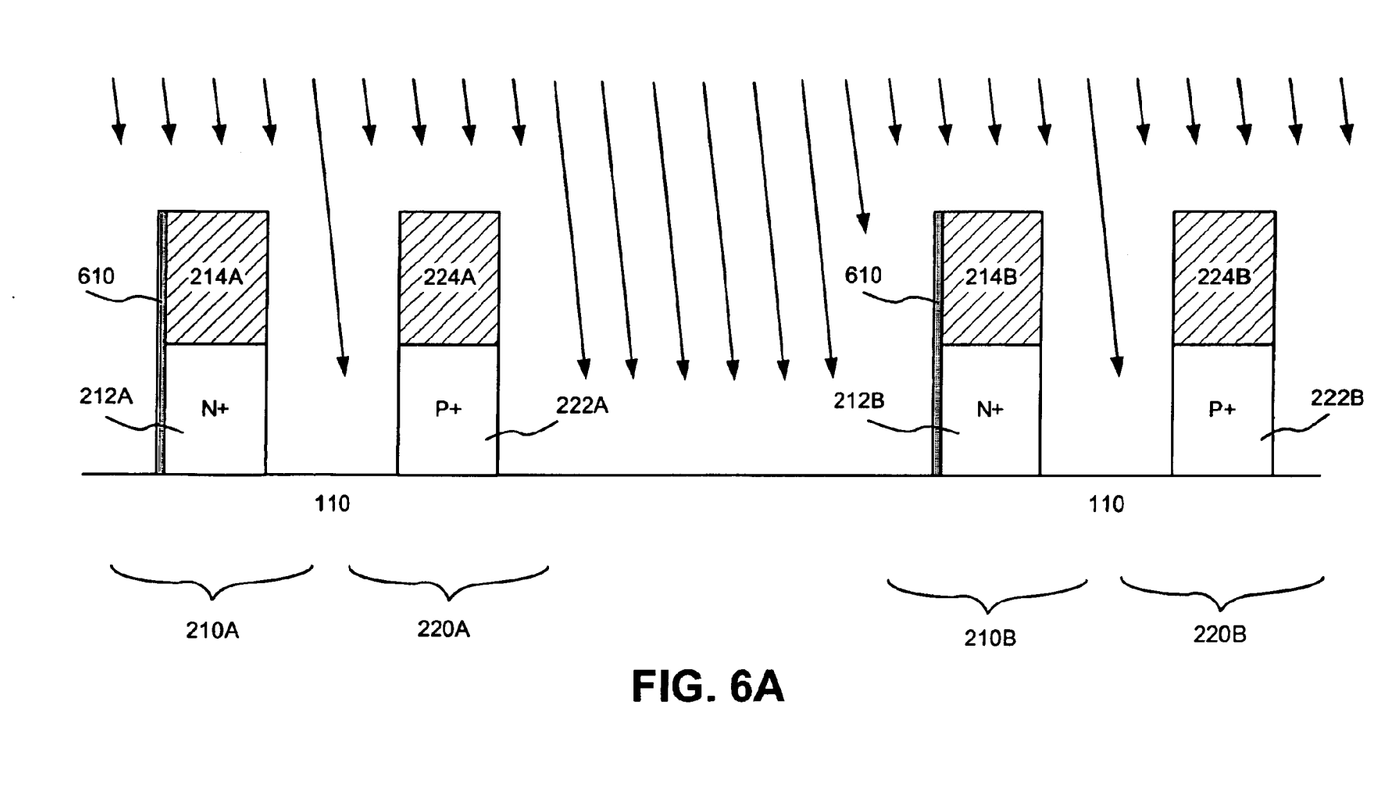
Figure 6B:
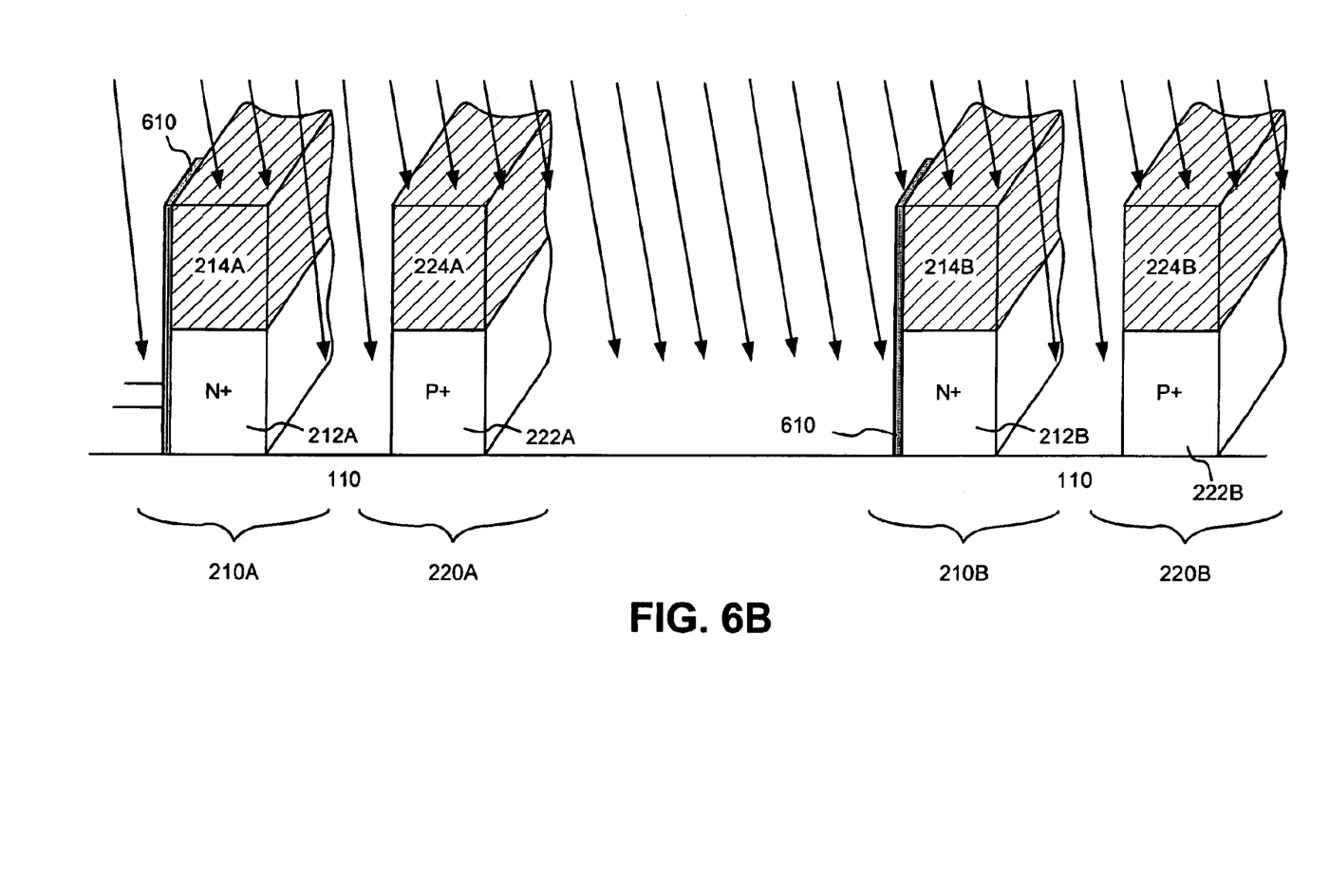

A hardened resist 610 may optionally be formed on the non-shadowed side surface of fin structures 212A and 212B, as illustrated in FIG. 6A. FIG. 6B shows a three dimensional view of FIG. 6A. Resist 610 may be formed to a thickness ranging from approximately 100 Å to 200 Å. In an exemplary implementation, resist 610 may be formed to a thickness of approximately 150 Å. While FIG. 6B shows resist 610 covering only a portion of fin structures 210A and 210B, resist 610 may be formed to cover the entire non-shadowed side of fin structures 210A and 210B.

A conventional implant process of p-type impurities, such as boron or BF$_2$, may then be optionally performed to dope fins 222A and 222B, as illustrated in FIGS. 6A and 6B. The p-type impurities may be implanted at an angle ranging from approximately 40 degrees to 50 degrees. In an exemplary implementation, the implant process may be performed at an angle of approximately 45 degrees.

The p-type impurities may be implanted at a dosage of about $5 \times 10^{14}$ atoms/cm$^2$ to about $1 \times 10^{15}$ atoms/cm$^2$ and an implantation energy of about 2 KeV to about 3 KeV for boron, which may depend on the thickness of fins 222A and 222B. After the implant process is complete, fins 222A and 222B may include silicon doped predominately, or only, with p-type impurities, as illustrated in FIGS. 6A and 6B. The implanting of p-type impurities does not dope fins 212A and 212B. For example, resist 610 and cap 214 block the p-type impurities from reaching fin 212.

After doping of fins 212A, 212B, 222A and 222B, conventional FinFET fabrication processing can be used to complete the transistor (e.g., forming the source and drain regions, contacts, interconnects and inter-level dielectrics for the FinFET device). For example, any remaining resist 510 or 610 may be stripped. Also, caps 214 and 224 may be removed.

Figure 7:
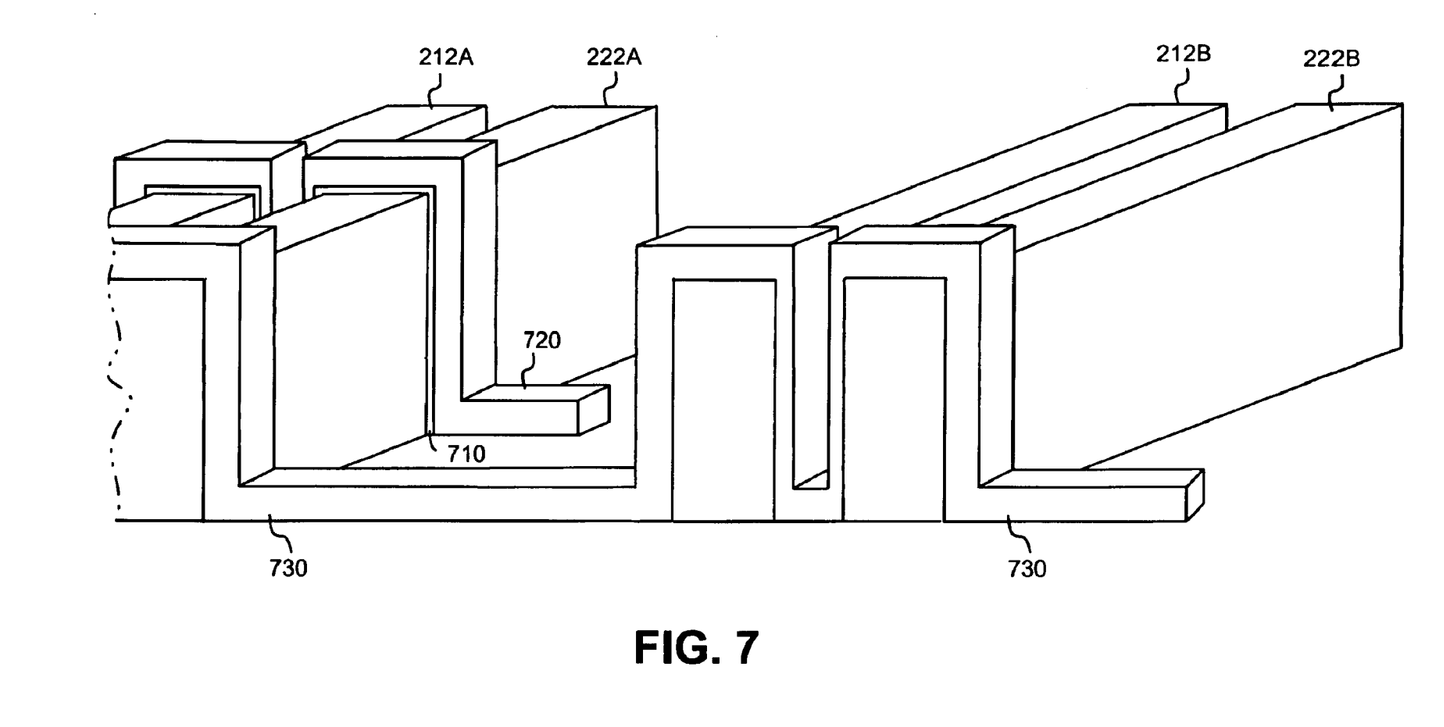
FIG. 7 illustrates exemplary gate and M1 jumper formation consistent with the invention.
Figure 8:
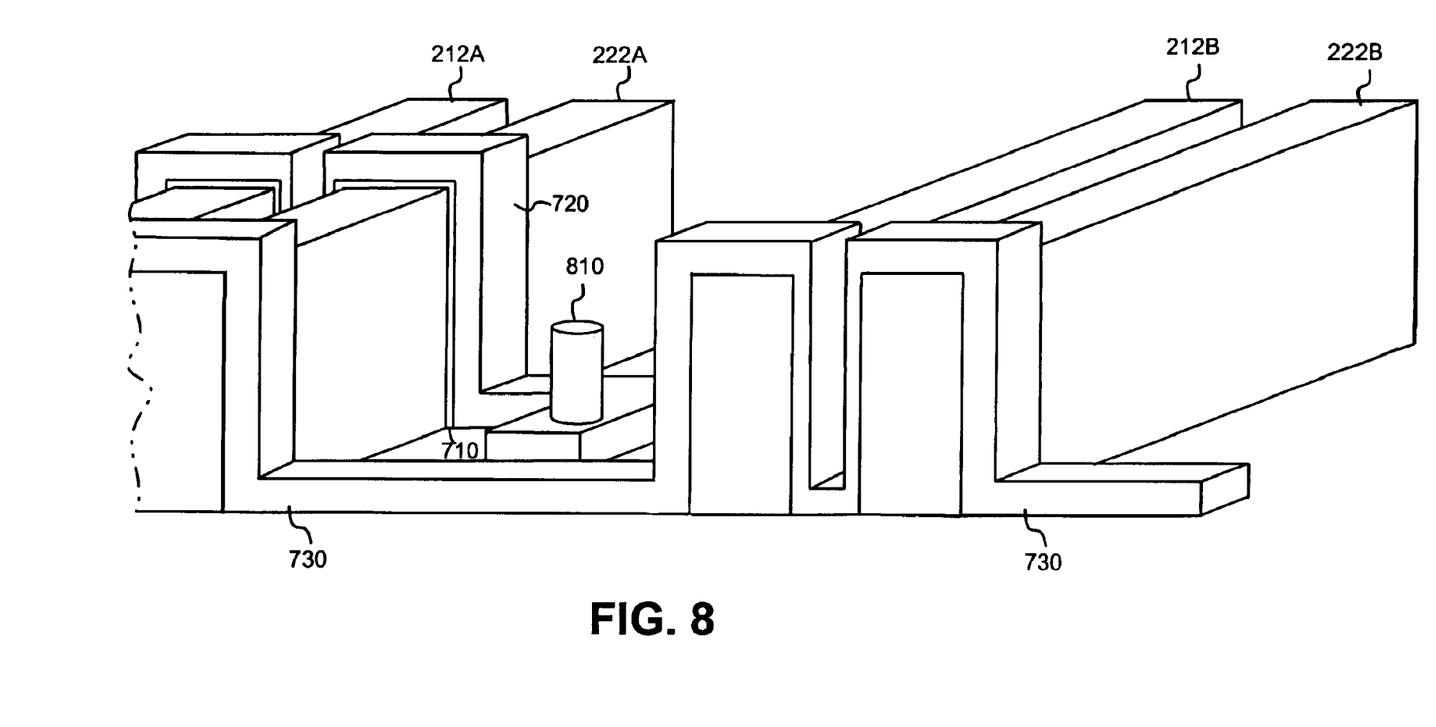
FIG. 8 illustrates exemplary gate interconnect formation consistent with the invention.

As illustrated in FIG. 7, a selective oxide strip 710 may be grown on fins 212A and 222A. Oxide strip 710 may be etched and a gate 720 and M1 jumper 730 may be formed by depositing and patterning polysilicon over fins 212A, 222A, 212B and 222B, as illustrated in FIG. 7. Polysilicon may then be deposited and patterned for forming the contacts and interconnect 810, as illustrated in FIG. 8.

Figure 9:
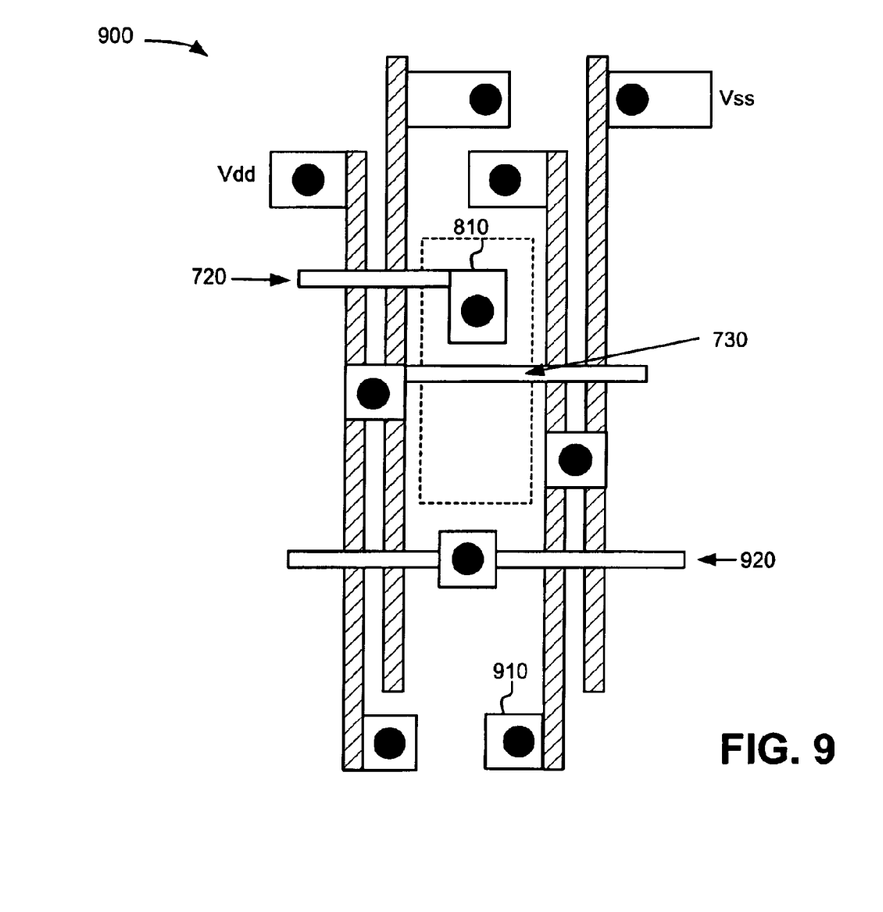
FIG. 9 illustrates an exemplary SRAM formed using shadow implantation techniques consistent with the invention.

Conventional processing may then be performed to complete the SRAM device. FIG. 9 illustrates a FinFET SRAM device 900 that may be formed from the above-processing. As illustrated, SRAM device 900 includes a group of separate M2 bitline contacts 910, an M1 wordline 920, an M1 jumper 730, a gate 720, and a gate interconnect 810.

CONCLUSION

Systems and methods consistent with the principles of the invention provide tightly spaced n-channel and p-channel fins for a SRAM cell. In implementations consistent with the present invention, the fins may be doped using shadowed implant techniques.

The foregoing description of exemplary embodiments of the present invention provides illustration and description, but is not intended to be exhaustive or to limit the invention to the precise form disclosed. Modifications and variations are possible in light of the above teachings or may be acquired from practice of the invention.

For example, in the above descriptions, numerous specific details are set forth, such as specific materials, structures, chemicals, processes, etc., in order to provide a thorough understanding of implementations consistent with the present invention. These implementations and other implementations can be practiced, however, without resorting to the details specifically set forth herein. In other instances, well known processing structures have not been described in detail, in order not to unnecessarily obscure the thrust of the present invention. In practicing the present invention, conventional deposition, photolithographic and etching techniques may be employed, and hence, the details of such techniques have not been set forth herein in detail.

While a series of acts has been described with regard to FIGS. 1–9, the order of the acts may be varied in other implementations consistent with the present invention. Moreover, non-dependent acts may be implemented in parallel.

No element, act, or instruction used in the description of the present application should be construed as critical or essential to the invention unless explicitly described as such. Also, as used herein, the article "a" is intended to include one or more items. Where only one "one" or similar language is used. The scope of the invention is their equivalents.

What is claimed is:

1. A memory device, comprising:
   a first pair of fins comprising a first fin and a second fin formed substantially parallel to one another, the first fin and second fin having a first width and being located a distance from one another that is approximately twice the first width;
   a second pair of fins comprising a third fin and a fourth fin formed substantially parallel to one another, the third fin and fourth fin having the first width and being located a distance from one another that is approximately twice the first width, wherein the second fin and the third fin are formed substantially parallel to one another and located a distance from one another that is approximately four times the first width;
   a source region formed at one end of each of the fins;
   a drain region formed at an opposite end of each of the fins;
   a gate formed over the first fin and the second fin;
   a wordline formed over each of the fins; and
   a bitline contact formed adjacent at least one of the fins.

2. The memory device of claim 1, wherein the first width ranges from about 50 Å to about 500 Å.

3. The memory device of claim 1, wherein a height of each of the fins ranges from about 50 Å to about 500 Å.

4. The memory device of claim 1, wherein the first and third fins are doped with a first type of impurities and the second and fourth fins are doped with a second type of impurities.

5. The memory device of claim 4, wherein the first type of impurities includes n-type impurities and the second type of impurities includes p-type impurities.

6. A method for forming a memory device, comprising:
   forming a first fin and a second fin substantially parallel to one another and to each have a first width and to be located a distance from one another that is approximately twice the first width;
   forming a third fin and a fourth fin substantially parallel to one another and to each have the first width and to be located a distance from one another that is approximately twice the first width and such that the second fin and the third fin are substantially parallel to one another and located a distance from one another that is approximately four times the first width;
   forming a source region at one end of each of the fins;
   forming a drain region at an opposite end of each of the fins;
   forming a gate over the first fin and the second fin;
   forming a wordline over each of the fins; and
   forming a bitline contact adjacent at least one of the fins.

7. The method of claim 6, wherein the memory device comprises a static random access memory (SRAM).

8. The method of claim 6, wherein the first width ranges from about 50 Å to about 500 Å.

9. The method of claim 6, further comprising:
   performing a first tilt angle implant process to dope the first and third fins with a first type of impurities; and performing a second tilt angle implant process to dope the second and fourth fins with a second type of impurities.

10. The method of claim 9, wherein the first type of impurities includes n-type impurities and the second type of impurities includes p-type impurities.

11. A device, comprising:

a first fin and a second fin formed substantially parallel to one another and located approximately a distance d from one another;

a third fin and a fourth fin formed substantially parallel to one another and located approximately the distance d from one another, wherein the second fin is formed substantially parallel to the third fin and is located approximately twice the distance d from the third fin and wherein the first and third fins are doped with n-type impurities and the second and fourth fins are doped with p-type impurities;

a source region formed at one end of each of the first, second, third and fourth fins;

a drain region formed at an opposite end of each of the first, second, third and fourth fins; and a gate formed over the first and second fins.

12. The device of claim 11, further comprising:

a wordline formed over each of the first, second, third and fourth fins; and a bitline contact formed adjacent at least one of the first, second, third and fourth fins.

13. The device of claim 12, wherein the device comprises a static random access memory (SRAM).

* * * * *